United States Patent [19]

Shioya et al.

[11] 4,394,401
[45] Jul. 19, 1983

[54] METHOD OF PLASMA ENHANCED CHEMICAL VAPOR DEPOSITION OF PHOSPHOSILICATE GLASS FILM

[75] Inventors: Yoshimi Shioya, Yokohama; Mamoru Maeda, Tama; Kanetake Takasaki, Tokyo; Mikio Takagi, Kawasaki, all of Japan

[73] Assignee: Fujitsu Limited, Kawasaki, Japan

[21] Appl. No.: 290,978

[22] Filed: Aug. 7, 1981

[30] Foreign Application Priority Data

Aug. 8, 1980 [JP] Japan ................ 55-108164

[51] Int. Cl.³ ......................................... H01L 21/316
[52] U.S. Cl. ........................................ 427/39; 427/85; 427/95; 427/45.1
[58] Field of Search .................. 427/39, 45.1, 85, 95

[56] References Cited

U.S. PATENT DOCUMENTS 4,223,048  9/1980  Engle ..................... 427/39
4,289,797  9/1981  Akselrad ................ 427/39

OTHER PUBLICATIONS

Rosler et al., "Plasma Enhanced CVD in a Novel LPCVD-Type System", Solid State Technology, vol. 24, No. 4, Apr. 1981, pp. 172–177.
Kern et al., "Advances in Deposition Processes for Passivation Films", J. Val. Sci. Technol, vol. 14, No. 5, Sep./Oct. 1977, pp. 1082–1099.
Hallahan, "Deposition of Plasma Silicon Oxide Thin Films in a Production Planar Reactor", J. Electrochem. Soc.: Electrochemical Science and Technology, vol. 126, No. 6, Jun. 1979, pp. 930–934.
Sinha et al., "Reactive Plasma Deposited Si–N Films for MOS-LSI Passivation", Journal of Electrochemical Society, Apr. 1978, pp. 601–608.
Electrochemical Society Meeting, "Extended Abstract", Properties of Plasma Deposited Silicon Oxide, 1979, pp. 262–265.

*Primary Examiner*—John D. Smith
*Attorney, Agent, or Firm*—Staas & Halsey

[57] ABSTRACT

A method of plasma enhanced chemical vapor deposition of a phosphosilicate glass film on a substrate from a reaction gas mixture including $SiH_4$, $N_2O$ and $PH_3$ is disclosed. This deposition is effected under the conditions such that a mol ratio of $N_2O$ to $SiH_4$ ($N_2O/SiH_4$) in the reaction gas mixture is 50 or more and that a mol ratio of $PH_3$ to $SiH_4$ ($PH_3/SiH_4$) in the reaction gas mixture is 0.08 or less. In the phosphosilicate glass film thus deposited, no cracking occurs due to a high temperature heat-treatment and due to the stress, caused by cooling the deposited films to an ordinarily ambient temperature.

10 Claims, 5 Drawing Figures

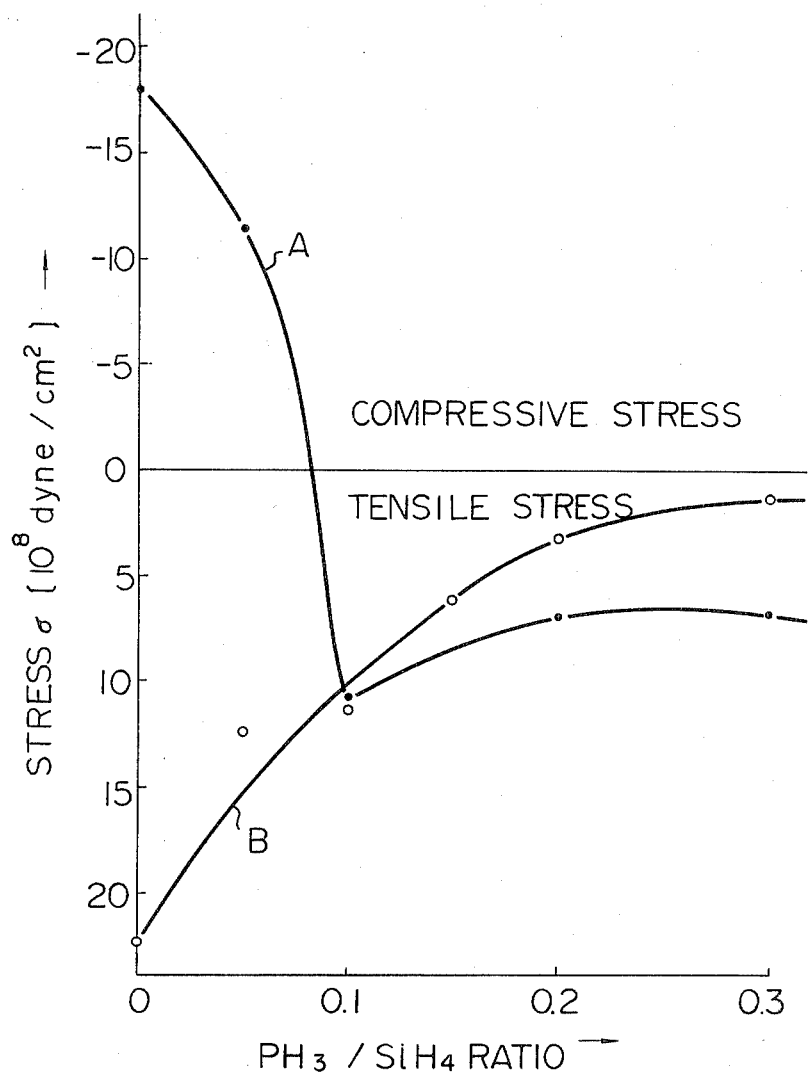

METHOD OF PLASMA ENHANCED CHEMICAL VAPOR DEPOSITION OF PHOSPHOSILICATE GLASS FILM

BACKGROUND OF THE INVENTION

The present invention relates to a method of plasma enhanced chemical vapor deposition (C.V.D.) of a phosphosilicate glass (P.S.G.) film on a substrate and, more specifically, it relates to a method of plasma enhanced C.V.D of a phosphosilicate glass film on a substrate such as a silicon substrate or an aluminum wire pattern on a silicon substrate.

As is known in the art, a phosphosilicate glass film is used as a protective coating (or a cover film) or an interlaminar insulation film for wire pattern layers. Conventional chemical deposition methods for depositing these films on substrates are mainly classified as a so-called "atmospheric pressure method" and a so-called "low pressure method". In the atmospheric pressure method, a phosphosilicate glass film is deposited on a substrate from a reaction gas mixture including $SiH_4$, $PH_3$ and $O_2$ under atmospheric pressure (i.e. 760 Torr) and at a temperature of from 350° to 450° C. On the other hand, in the low pressure method, a phosphosilicate glass film is deposited on a substrate from a reaction gas mixture including $SiH_4$, $PH_3$ and $O_2$ under a low pressure (e.g. 1 Torr) and at a temperature of from 350° to 450° C.

Furthermore, with regard to the deposition of a nitride film or amorphous silicon, a so-called "plasma enhanced (or assisted) chemical vapor deposition method" is proposed. According to this method, a silicon nitride film or amorphous silicon film is deposited at a relatively low temperature (e.g. 20°–450° C.) by applying a radio frequency signal between parallel flat plate electrodes to generate plasma gas (e.g. see Electrochemical Society Meeting "Extended Abstract" 79-1, 262(1979) and Journal of Electrochemical Society 125, 601(1978)).

However, there are problems in the phosphosilicate glass films obtained from the above-mentioned conventional chemical vapor deposition methods in that, in the case where the deposited phosphosilicate glass films are heat-treated, even at a temperature of about 600° C., cracks are likely to be generated in the deposited films. In addition, in the case where the deposited phosphosilicate glass films are cooled to room temperature after the deposition, the deposited phosphosilicate glass film is strained, whereby cracks are likely to be generated in the deposited films.

SUMMARY OF THE INVENTION

Accordingly, an object of the present invention is to obviate the above-mentioned problems in the conventional deposition of phosphosilicate glass films, by providing a method of plasma enhanced chemical vapor deposition of a phosphosilicate glass film on a substrate, in which phosphosilicate glass films are deposited without the generation of cracking due to a high temperature heat-treatment and without the generation of cracking due to the stress caused by cooling the deposited films to room temperature.

Other objects and advantages of the present invention will be apparent from the description set forth hereinbelow.

In accordance with the present invention, there is provided a method of plasma enhanced chemical vapor deposition of a phosphosilicate glass film on a substrate from a reaction gas mixture including $SiH_4$, $N_2O$ and $PH_3$. The deposition is effected under conditions that the mol ratio of $N_2O$ to $SiH_4$ ($N_2O/SiH_4$) in the reaction gas mixture is 50 or more and the mol ratio of $PH_3$ to $SiH_4$ ($PH_3/SiH_4$) in the reaction gas mixture is 0.08 or less.

The present invention will be better understood from the description set forth below with reference to the accompanying drawings:

BRIEF DESCRIPTION OF THE DRAWINGS

FIG. 5 is a graph illustrating the correlation between the stress of the phosphosilicate glass films deposited according to the plasma enhanced chemical vapor deposition method in Example 2 and the mol ratio of $PH_3/SiH_4$, wherein the correlation of the film according to the present invention is shown in curve A and the correlation of the film according to the conventional atmospheric pressure method is shown in curve B.

DESCRIPTION OF THE PREFERRED EMBODIMENT

Figure 1:
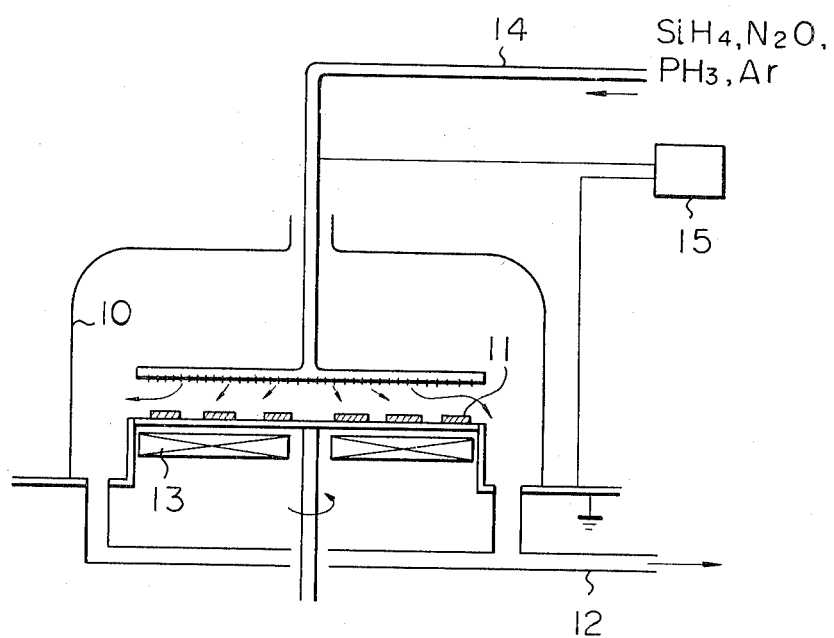
FIG. 1 is a schematic sectional view illustrating one embodiment of an apparatus for carrying out the plasma enhanced chemical vapor deposition method of the present invention.

Referring to FIG. 1, a plasma enhanced chemical vapor deposition method of a phosphosilicate glass film (i.e. PSG film) on a substrate 11 in a bell-jar type plasma enhanced chemical vapor deposition apparatus 10 will be explained in detail. In the case where silicon oxide films ($Si_xO_y$, typically $SiO_2$) are to be deposited on a substrate, the following procedure can also be applied, except that a reaction gas mixture including $SiH_4$, $N_2O$ and Ar is used in lieu of a reaction gas mixture including $SiH_4$, $N_2O$, $PH_3$ and Ar. In addition, in the case where $B_2H_6$ gas or $AsH_3$ gas is used, in lieu of $PH_3$ gas, in the following procedure, a borosilicate glass film or an arsenosilicate glass film can be deposited on a substrate, respectively.

In the practice of the plasma enhanced chemical vapor deposition according to the present invention, a substrate 11, on which a PSG film is to be deposited, is placed in a bell-jar 10 made of, for example, quartz. The system within the ball-jar 10 is evacuated through a line 12 and the temperature of the atmosphere in the bell-jar 10 is heated to a temperature of from 20° to 450° C., preferably from 300° to 450° C., by means of a heater 13, while the pressure of the system is maintained under a vacuum pressure of from 0.1 to 2 Torr, preferably from 0.5 to 1 Torr. Under the above-mentioned conditions, a reaction gas mixture of $SiH_4$, $N_2O$, $PH_3$ and Ar (for example, a gas mixture of 1% $SiH_4$ in Ar, 1% $PH_3$ in Ar and $N_2O$) is fed through a line 14 into the bell-jar 10. Then, a PSG film is deposited on the substrate 11 by applying a radio-frequency power of from 50 KHz to 2.45 GHz (most preferably 500 KHz) by using an oscillator 15.

It should be noted that, in order to deposit, on a substrate, a phosphosilicate glass film in which no substantial generation of cracking due to a high temperature treatment or due to the stress caused by cooling the deposited film to an ordinarily ambient temperature occurs, the mol ratio of $N_2O/SiH_4$ must be 50 or more, preferably 50 through 100 and the mol ratio of $PH_3/SiH_4$ must be 0.08 or less, preferably 0.03 through 0.06. In the case where the mol ratio of $N_2O/SiH_4$ is less than 50, cracking is undesirably generated in the deposited PSG film when the film is heat-treated at a high temperature. Furthermore, in the case where the mol ratio of $PH_3/SiH_4$ is greater than 0.08, cracking is undesirably generated in the deposited PSG film when the film is subjected to a heat-treatment at a high temperature.

The present invention will now be further explained by, but is by no means limited to, the following Examples.

EXAMPLE 1

A silicon oxide film having a thickness of 1 micron was deposited on a silicon substrate by using a plasma enhanced chemical vapor deposition apparatus as illustrated in FIG. 1. The plasma deposition runs were carried out by using a reaction gas mixture of $SiH_4$, $N_2O$ and Ar under the following conditions.

Radio frequency: 13.56 MHz×40 W
Temperature: 300° C.
Pressure: 1 Torr
$N_2O/SiH_4$ Mol Ratio: 5, 10, 20, 50, 100 and 200

Figure 2:
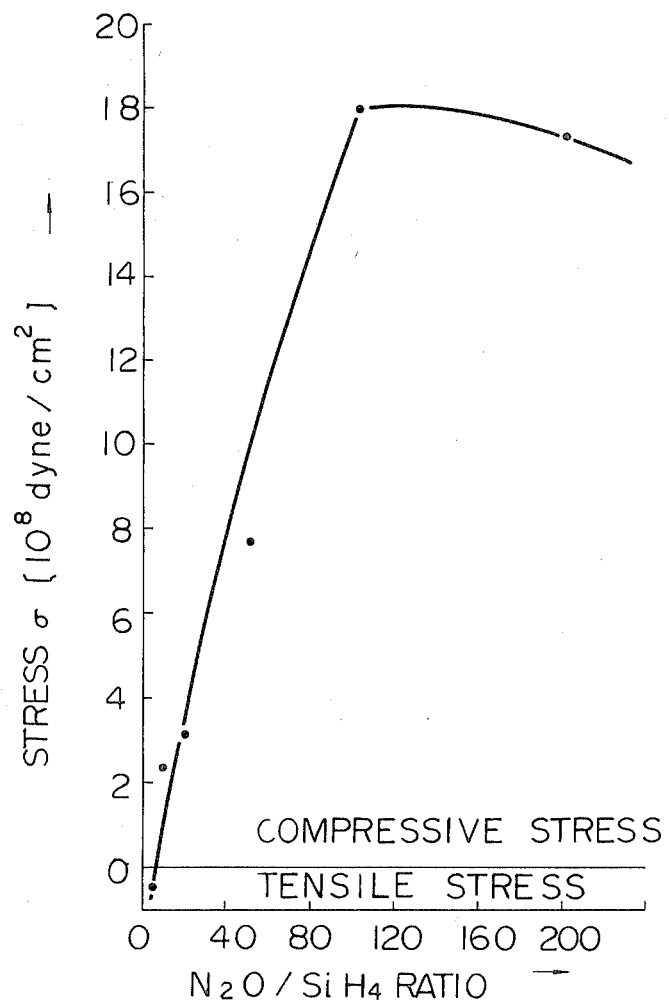
FIG. 2 is a graph illustrating a correlation between the stress of the silicon oxide and the mol ratio of $N_2O/SiH_4$ in the plasma chemical vapor deposition of Example 1.

The stress of each silicon oxide film deposited at the above-mentioned $N_2O/SiH_4$ ratios was determined. The correlation between the determined stress values $\sigma$ ($\times 10^8$ dyne/cm) and the mol ratio of $N_2O/SiH_4$ is shown in FIG. 2. The stress was determined according to a so-called Newton ring method.

Samples of the silicon oxide films having a thickness of 1 micron obtained from the above-mentioned plasma enhanced chemical vapor deposition at the $N_2O/SiH_4$ ratios of 5, 50 and 100 were subjected to a heat-treatment at a temperature of 600° C., 800° C. or 1000° C. in a nitrogen atmosphere to observe the generation of crackin in the films. The results are shown in the following Table 1.

TABLE 1

| $N_2O/SiH_4$ | Heat-Treatment Temperature | | |
|---|---|---|---|
| Ratio | 600° C. | 800° C. | 1000° C. |
| 5 | Cracking | Cracking | Cracking |
| 50 | No Cracking | No Cracking | No Cracking |
| 100 | No Cracking | No Cracking | No Cracking |

As is clear from the results in Table 1, in the case where the mol ratio of $N_2O/SiH_4$ is 50 or more, no cracking is generated in the deposited films at a high temperature heat-treatment. It is believed that no cracking is generated for the reason that the content of $H_2$ is the deposited films is decreased and the density of the deposited films is increased by the use of the mol ratio of $N_2O/SiH_4$ of 50 or more.

Furthermore, as shown in FIG. 2, in the cases where the mol ratios of $N_2O/SiH_4$ are 50 and 100, the deposited films are under compressive stress. In contrast, in this case where the mol ratio of $N_2O/SiH_4$ is 5, the deposited film is under tensile stress. This means that, in the case where the mol ratio of $N_2O/SiH_4$ is 5, since the tensile stress is further increased during the heat-treatment due to the fact that the thermal expansion coefficient of the silicon substrate is larger than that of the deposited silicon oxide film, and also since the content of $H_2$ in the deposited silicon oxide film is large and the deposited film is brittle, cracking is generated in the deposited films. In contrast, in the case where the mol ratio of $N_2O/SiH_4$ is 50 or 100, the compressive stress of the deposited film can be offset by the tension due to the difference in the thermal expansion coefficients between the silicon substrate and the deposited silicon oxide film. As a result, no cracking is generated in the deposited silicon oxide film.

Figure 3:
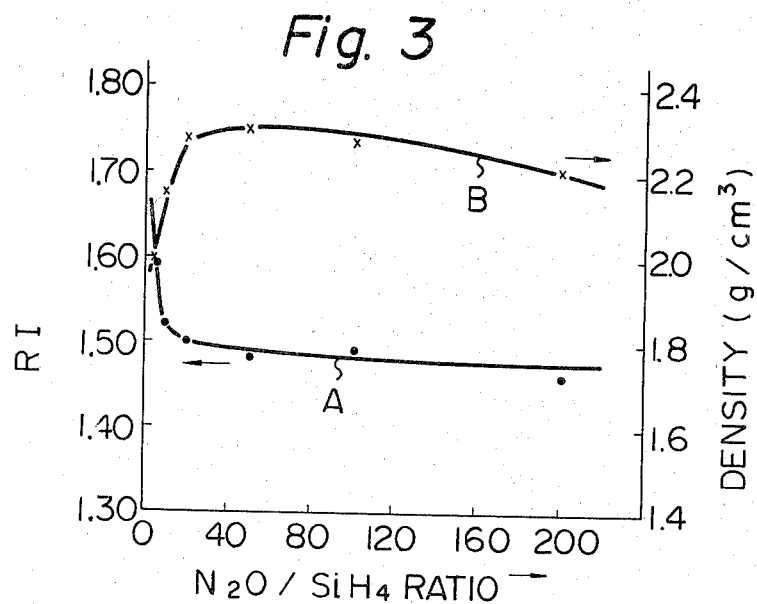
FIG. 3 is a graph illustrating a correlation between a reflection index (R.I.) of the plasma enhanced C.V.D silicon oxide films (see curve A) or the density of the silicon oxide films (see curve B) and the mol ratio of $N_2O/SiH_4$ in the plasma chemical vapor deposition of Example 1.

The correlation between the R.I. (i.e. refractive index) or the density of the silicon oxide film deposited on a silicon substrate and the mol ratio of $N_2O/SiH_4$ is illustrated by the graph of FIG. 3. In FIG. 3, curve A shows the correlation between the R.I. and the ratio of $N_2O/SiH_4$ and curve B shows the correlation between the density and the ratio of $N_2O/SiH_4$.

Figure 4:
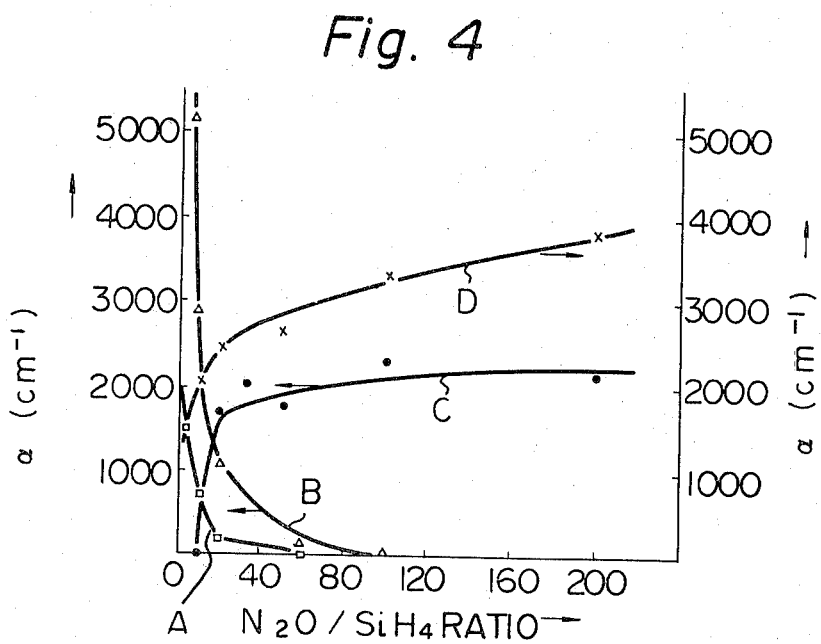
FIG. 4 is a graph illustrating the correlation between an infrared absorption coefficient α of the silicon oxide film obtained in Example 1 and thermal ratio of $N_2O/SiH_4$ in the plasma chemical vapor deposition of Example 1.

Furthermore, the correlation between an infrared absorption coefficient $\alpha$ of the silicon oxide film and the mol ratio of $N_2O/SiH_4$ is graphically illustrated in FIG. 4. In FIG. 4, curve A shows the absorption coefficient (at 2240 $cm^{-1}$) of SiH, curve B the absorption coefficient (at 880 $cm^{-1}$) of $(SiH_2)n$ or $Si_2O_3$, curve C the absorption coefficient (at 810 $cm^{-1}$) of SiO and curve D the absorption coefficient (at 1070–1090 $cm^{-1}$) of SiO (expansion and contraction).

As is clear from the graphs shown in FIGS. 3 and 4, the silicon oxide film obtained from the plasma enhanced chemical vapor deposition at the mol ratio of $N_2O/SiH_4$ of 50 or more, has a smaller content of $H_2$ compared to a mol ratio which is $N_2O/SiH_4$ of less than 50. Thus, $SiH_4$ is thoroughly reacted with $O_2$ at the mol ratio of $N_2O/SiH_4$ of 50 or more, whereby a silicon oxide film having good film properties can be formed.

EXAMPLE 2

A phosphosilicate glass (PSG) film having a thickness of 1 micron was deposited on a silicon substrate by using a plasma enhanced chemical vapor deposition apparatus as illustrated in FIG. 1. The plasma deposition runs were carried out by using a reaction gas mixture of $SiH_4$, $PH_3$, $N_2O$ and Ar under the following conditions.

Radio-frequency: 13.56 MHz×40 W
Temperature: 300° C.
Pressure: 1 Torr
$N_2O/SiH_4$ Mol Ratio: 100
$PH_3/SiH_4$ Mol Ratio: 0*, 0.05, 0.1, 0.15, 0.2 and 0.3
*In this case, silicon oxide film was deposited.

The stress of each PSG film deposited at the above-mentioned $PH_3/SiH_4$ ratios was determined in a manner as described in Example 1. The correlation between the stress values $\sigma$ ($\times 10^8$ dyne/cm$^2$) and the mol ratio of $PH_3/SiH_4$ is shown in curve A of FIG. 5.

On the other hand, a phosphosilicate glass film having a thickness of 1 micron was deposited on a silicon substrate according to a conventional atmospheric pressure method. The deposition temperature was 425° C. and the deposition pressure was 760 Torr. The compositions of the reaction gas mixture were $SiH_4$, $PH_3$, $O_2$ and Ar. The stress of each PSG film deposited was determined in a manner as described above. The correlation between the stress $\sigma$ ($\times 10^8$ dyne/cm) and the mol ratio of $PH_3/SiH_4$ is shown in curve B of FIG. 5.

As is clear from the comparison of curves A and B in FIG. 5, according to the plasma enhanced chemical vapor deposition method of the present invention, the PSG films which are under compressive stress can be deposited on a substrate by using the mol ratio of $PH_3/SiH_4$ of 0.08 or less, even in the case where the PSG film having a small concentration of phosphorous P is deposited. Thus, since the resultant deposited films are under compressive stress, the deposited films are resistant to cracking. In contrast, since the PSG films having a small concentration of P and deposited by the conventional atmospheric pressure method are under large tensile stress, cracking is likely to occur in the deposited films.

As exemplified above, in the case where a PSG film having a low concentration of P and an excellent water vapor resistance (i.e. in the case where the concentration of P in the deposited film is large, phosphoric acid is formed in the film due to the absorption of $H_2O$ from the outside, whereby the water vapor resistance is decreased), is desired to be formed, the present invention can be effectively used. This type of film is useful as a cover film, an interlaminar insulation film or the like.

What is claimed is:

1. A method of plasma enhanced chemical vapor deposition of a phosphosilicate glass film on a substrate comprising the step of exposing the substrate to a reaction gas mixture including $SiH_4$, $N_2O$ and $PH_3$, said deposition being effected under conditions such that the reaction gas mixture has a mol ratio of $N_2O$ to $SiH_4$ ($N_2O/SiH_4$) which is greater than or equal to 50 and a mol ratio of $PH_3$ to $SiH_4$ ($PH_3/SiH_4$) which is less than or equal to 0.08.

2. A method as claimed in claim 1, wherein the exposing step is effected at a pressure of from 0.1 to 2 Torr and at a temperature of from 20° to 450° C.

3. A method as claimed in claim 1, wherein the exposing step is effected by using a radio-frequency power of from 50 KHz to 2.45 GHz.

4. A method as claimed in claim 1, wherein the mol ratio of $N_2O$ to $SiH_4$ in the reaction gas mixture is from 50 to 100.

5. A method as claimed in claim 1, wherein the mol ratio of $PH_3$ to $SiH_4$ in the reaction gas mixture is from 0.03 to 0.06.

6. A method of depositing a phosphosilicate glass film on a substrate, comprising the steps of:
    (a) placing the substrate within a chamber;
    (b) evacuating the chamber;
    (c) heating the atmosphere in the chamber;
    (d) introducing a reaction gas mixture of $SiH_4$, $N_2O$, and $PH_3$ into the chamber, the mol ratio of $N_2O$ to $SiH_4$ being greater than or equal to 50 and the mol ratio of $PH_3$ to $SiH_4$ being less than or equal to 0.08; and
    (e) applying radio-frequency power to the reaction gas mixture so that the phosphosilicate glass film is deposited on the substrate.

7. A method as claimed in claim 6, wherein said evacuating step (b) includes maintaining the atmosphere in the chamber at a pressure of from 0.1 to 2 Torr.

8. A method as claimed in claim 7, wherein the step (e) includes applying a radio-frequency power of from 50 KHz to 2.45 GHz.

9. A method as claimed in claim 8, wherein said heating step (c) comprises heating the atmosphere to a temperature of from 20° to 450° C.

10. A method as claimed in claim 9, wherein the mol ratio of $N_2O$ to $SiH_4$ in the reaction gas mixture is from 50 to 100 and wherein the mol ratio of $PH_3$ to $SiH_4$ in the reaction gas mixture is from 0.03 to 0.06.

* * * * *

UNITED STATES PATENT AND TRADEMARK OFFICE
CERTIFICATE OF CORRECTION

PATENT NO. : 4,394,401
DATED : JULY 19, 1983
INVENTOR(S) : YOSHIMI SHIOYA ET AL.

It is certified that error appears in the above-identified patent and that said Letters Patent is hereby corrected as shown below:

Front page, [56] References Cited, line 9, "Val." should be --Vac.--;

[57] ABSTRACT,
line 5, "a" should be --the--;
line 6, "that a" should be --the--;
line 9, "due to" should be --as a result of--;
line 10, "and due to" should be --or--; and delete ",";
line 11, "ordinarily" should be --ordinary--.

Col. 2, line 32, after ";" insert --and--.

Col. 3, line 51, "crackin" should be --cracking--.

Col. 4, line 40, "which is" should be --of--; and "of" should be --which is--.

Signed and Sealed this

Eleventh Day of October 1983

[SEAL]

Attest:

GERALD J. MOSSINGHOFF

Attesting Officer     Commissioner of Patents and Trademarks